United States Patent [19]

Kenny et al.

[11] Patent Number: 5,832,986
[45] Date of Patent: Nov. 10, 1998

[54] HEAT EXCHANGER

[75] Inventors: Gary R. Kenny, Rochester; Dean Leonard Smith, Pittsford; Roger Stanley Kerr, Brockport, all of N.Y.

[73] Assignee: Eastman Kodak Company, Rochester, N.Y.

[21] Appl. No.: 674,221

[22] Filed: Jun. 28, 1996

[51] Int. Cl.[6] .............................. F28F 13/12; H05K 7/20
[52] U.S. Cl. .................. 165/80.3; 165/121; 165/185; 174/16.3; 361/697
[58] Field of Search .................................. 165/80.3, 122, 165/185, 121; 174/16.3; 361/697, 695

[56] References Cited

U.S. PATENT DOCUMENTS

| 3,592,260 | 7/1971 | Berger ..................................... 165/121 |
| 3,970,411 | 7/1976 | Wallman . |
| 4,164,690 | 8/1979 | Muller et al. . |
| 4,165,950 | 8/1979 | Masai et al. . |
| 4,513,812 | 4/1985 | Papst et al. .......................... 165/121 X |
| 4,666,373 | 5/1987 | Sugiura . |
| 4,768,581 | 9/1988 | Gotwald et al. ........................ 165/80.3 |
| 4,879,891 | 11/1989 | Hinshaw . |
| 4,884,331 | 12/1989 | Hinshaw . |
| 5,494,098 | 2/1996 | Morosas ................................. 165/121 |
| 5,526,875 | 6/1996 | Lin ......................................... 165/80.3 |
| 5,535,094 | 7/1996 | Nelson et al. .......................... 361/697 |

FOREIGN PATENT DOCUMENTS 36 09 037.9  10/1986  Germany .
94 04 388.4   5/1994  Germany .

OTHER PUBLICATIONS

Goldberg, Norman: "Narrow Channel Forced Air Heat Sink"; IEEE Transactions on Components, Hybrids and Manufacturing Technology, No. 1, Mar. 1984, New York, USA, pp. 154–159, XP002040119.

Patent Abstracts of Japan: vol. 096, No. 008, 30 Aug. 1996 and JP 08 098461 A (Tokyo Parts Ind. Co. Ltd.), 12 Apr. 1996, "Abstract".

*Primary Examiner*—Leonard R. Leo
*Attorney, Agent, or Firm*—Clyde E. Bailey, Sr.

[57] ABSTRACT

An improved heat exchanger (10) has a heat sink (22) with fins (24) having a very high heat transfer coefficient structurally associated with a compact, high air velocity air moving means (14). Air moving means (14) of the invention employs a backward curved impeller (16) driven by a compact planar dc motor (50) adapted to yield higher than normal impeller speeds with superior thermal transfer performance.

10 Claims, 7 Drawing Sheets

SECTION 3—3

HEAT EXCHANGER

CROSS-REFERENCE TO RELATED APPLICATIONS

This application is related to the following applications: Ser. No. 08/672,893 for "Image Processing Equipment" by Gary R. Kenny, Dean L. Smith, and Roger S. Kerr; and Ser. No. 08/671,994 for "Air Moving Device" by Gary R. Kenny, Dean L. Smith, and Roger S. Kerr, both filed concurrently on Jun. 28, 1996.

FIELD OF THE INVENTION

The invention relates generally to heat exchangers, and more particularly, the invention concerns an improved heat exchanger having a heat sink with a high heat transfer coefficient in conjunction with a compact air moving device capable of achieving high air velocities and overcoming high static pressure thereby producing greater thermal performance.

BACKGROUND OF THE INVENTION

Heat exchangers or devices for enhancing or facilitating the flow of heat are numerous in the art. They exist in a range of sizes and for a wide range of applications. The smallest are included, for instance, in miniature cryocoolers for infrared thermal imaging, superconducting electronic applications, and the like. At the other extreme, the largest heat exchangers are those found in electric power stations. In either case, the thermal performance of heat exchangers is generally related to the frictional pressure drop or static pressure drop through the heat sink.

It is well known for turbulent flow that the thermal ability of a heat exchanger can be improved by increasing the ability of the air mover to overcome resistance to flow or static pressure losses through the heat sink. Experience indicates that with narrow fluid passageways in the heat sink, static pressure plays a prominent role in the thermal performance of the heat exchanger. A suitable air moving element, such as a blower or fan, is usually structurally associated with the heat sink to aid in facilitating the heat transfer process. This is done by increasing the surface area of the heated body or surface in contact with the cooling air stream. Another technique to improve the heat transfer process is to increase the air velocity through the heat sink. Both of the above techniques involves decreasing the thermal resistance of the component surface to the air stream.

Depicted in FIG. 1, a prior art heat exchanger 1 for electronic devices typically employ a tubeaxial fan 2 directly mounted to the heat sink 3 having a plurality of fins 4. These existing devices, of the type illustrated in FIG. 1, are generally limited in the amount of fin surface area that can be provided for any given heat sink volume, due to the limited static pressure capability of the tubeaxial fan 4. Remote mounted blowers may also be used but, they have the inherent disadvantage of not offering a compact solution that can run independent from the rest of the system. In addition, having a remote mounted blower complicates the design due to the routing of the ducting. Where compact systems are required, these remote blowers are not an option. A shortcoming of the tubeaxial fan is its inability to overcome any appreciable resistance to airflow. Increasing the fin surface area increases the airflow resistance that the tubeaxial fan must overcome. At some point, increasing the surface area will decrease heat sink performance, as the fan invariably becomes the limiting factor in the amount of air flow resistance it can overcome. Thus, for a given heat sink volume, there is a limit to the thermal resistance that a direct mounted tubeaxial fan can provide.

Therefore, there persists a need for a heat exchanger that is compact, has an air mover that supplies enough power to generate high air velocities and to overcome static pressure in the heat sink, is reliable and requires low maintenance, and that is inexpensive to manufacture.

SUMMARY OF THE INVENTION

It is, therefore, an object of the invention to provide an improved heat exchanger that can achieve superior thermal performance.

Another object of the invention is to provide an improved heat exchanger that is easy to manufacture, light weight, compact and is cost effective.

Yet another object of the invention is to provide an improved heat exchanger that has greater reliability and requires less maintenance than existing units.

It is a feature of the invention that the improved heat exchanger of the invention includes a heat sink having very narrow fluid passageways, and therefore high resistance to fluid flow, which cooperates with a compact, high air velocity air moving means capable of overcoming the static pressure in the heat sink.

To overcome one or more problems in the prior art, there is provided in one aspect of the invention, an improved heat exchanger, comprising a heat sink having a closed base and a plurality of substantially parallel closely spaced fins supported by the base. The closely spaced fins form a plurality of narrow fluid passageways. The plurality of fluid passageways form a fluid inlet face and a fluid outlet face opposite the fluid inlet face. Moreover, the plurality of fins have a heat transfer coefficient defined by the equation $$h = Nuk/De$$

where h is the convective heat-transfer coefficient, Nu is the Nusselt Number, a dimensionless number, k is the thermal conductivity of the fluid; and De is the equivalent or hydraulic diameter of the formed fluid passageway. In this equation, $De = 4Ac/P$, and where Ac is the flow cross sectional area of a fluid passageway, and P is the wetted perimeter or fin surface exposed to fluid.

Further, an air moving means is structurally associated with the heat sink. In this embodiment of the invention, the air moving means comprises at least a partial enclosure configured to provide a directional fluid path from outside the enclosure into and through the enclosure. An impeller is arranged for rotational movement in the enclosure. The impeller has a plurality of backward curved blades exposed to an opening in the enclosure for convectively moving fluid into the enclosure and along the directional fluid flow path through the plurality of fluid passageways of the heat sink. Moreover, the impeller, operably connected to drive means, is capable of producing a fluid velocity and static pressure to force fluid outside the enclosure through the closely spaced fins of the heat sink.

It is, therefore, an advantageous effect of the invention that an improved heat exchanger having far superior thermal performance is compact, light weight, cost effective, reliable and easy to maintain.

BRIEF DESCRIPTION OF THE DRAWINGS

The foregoing as well as other objects, features and advantages of this invention will become more apparent from the appended Figures, wherein like reference numerals denote like elements, and wherein.

DESCRIPTION OF PREFERRED EMBODIMENTS

Figure 2:
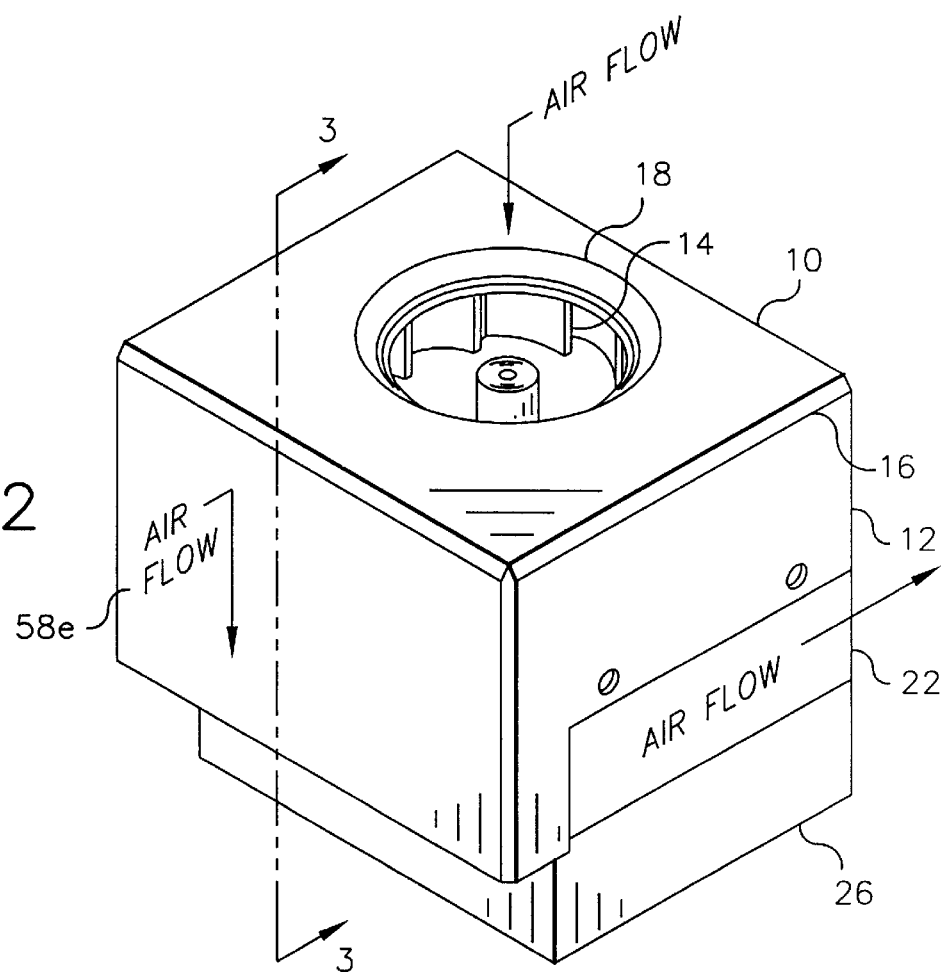
FIG. 2 is a perspective view of the heat exchanger of the invention, partially torn away to show fan and heat sink.

Turning now to the drawings, and in particular to FIG. 2, the improved heat exchanger 10, in accordance with the principles of the invention, is illustrated. According to FIGS. 2–3, heat exchanger 10, broadly defined, has at least a partial enclosure or housing, 12 and a compact fluid or air moving means, preferably a fan, 14, having impeller 16 (described below), exposed in an opening 18 of housing 12. Impeller 16, as discussed below, comprises a plurality of backward curved blades 20 which forcefully directs air through the enclosure 12. Cooperatively associated with air moving means 14 and arranged in enclosure 12 is a heat sink 22 (one or more heat sinks may be employed) for absorbing and then dissipating fluid (heat), as described fully below. Air moving means 14, described herein, is structurally connected to heat sink 22 with preferably low thermal resistant screws and washers (not shown). Those skilled in the art will appreciate that air moving means 14 need not be connected to heat sink 22 nor limited to a single heat sink 22. It is, therefore, within the contemplation of the invention that a single air moving means can provide forced convection of fluid (air) moving through a plurality of heat sinks 22. Other important detailed features of the heat sink 22, air moving means 14 and enclosure or housing 12 are defined in greater details herein below.

Heat Sink (22)

Figure 4:
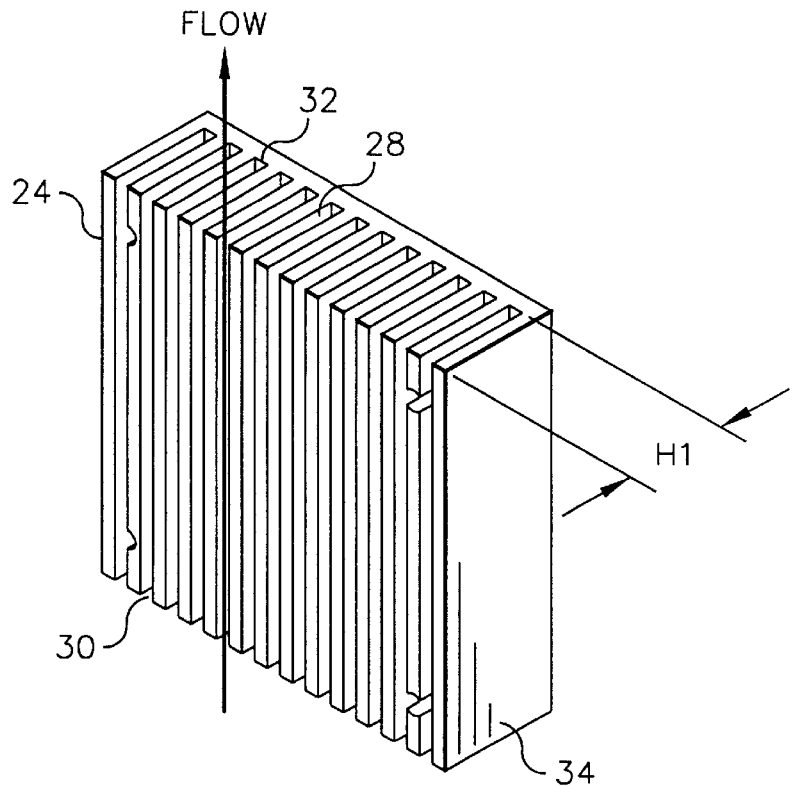
FIG. 4 is a schematic view of a heat sink showing spaced fins.
Figure 5:
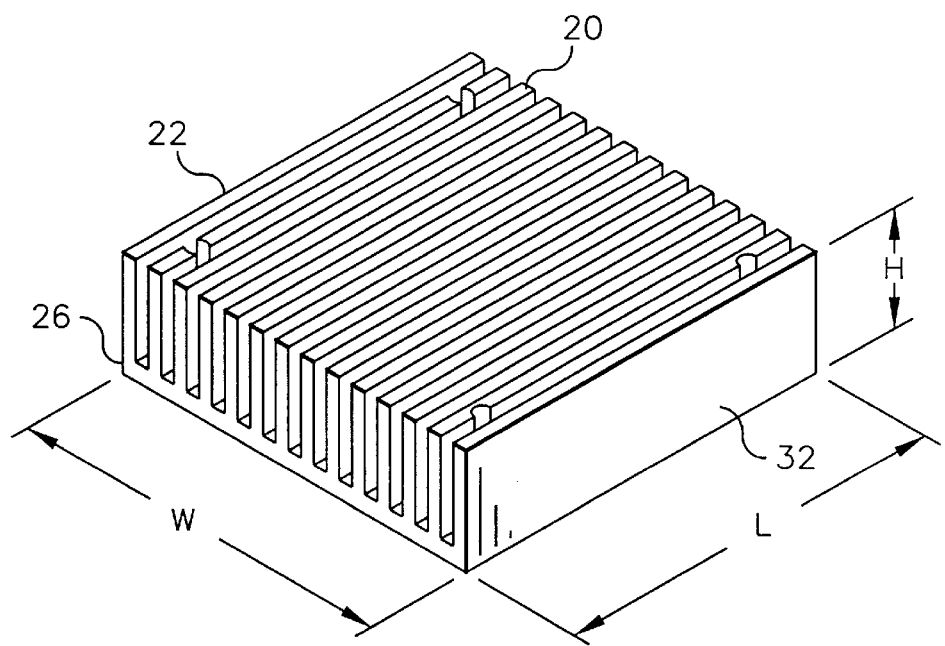
FIG. 5 is an orthographic view of a heat sink showing closely spaced fins.

Illustrated in FIGS. 4–5, a heat sink 22 contemplated by the invention includes a plurality of substantially parallel closely spaced fins 24 (fin spacing being exaggerated for illustrative purposes only) supported by base (not shown). In the preferred embodiment, the plurality of closely spaced fins 24 have an average space width ($S_f$), illustrated in FIG. 4, between about 0.008 inches (0.02032 cm) to about 0.060 inches (0.1524 cm). The lower limit of the average space width ($S_f$) is determined by the present manufacturing capabilities and/or mechanical stability and/or uniformity of the fin. Closely spaced fins 24 form a plurality of narrow fluid passageways 28. As illustrated in FIG. 4, an enlarged view of heat sink 22 shows clearly the plurality of fluid passageways 28 forms a fluid inlet face 30 and a fluid outlet face 32 opposite the fluid inlet face 30. According to the illustration in FIG. 5, a typical heat sink 22 contemplated by our invention has a plurality of closely spaced fins 24 having a height (H), width (W) and length (L). The tightly spaced arrangement of the fins 24 of heat sink 22 results in very narrow fluid passageways 28 and, therefore, increased resistance to air or fluid flow passing through the inlet face 30 and exiting the outlet face 32.

An important property of heat sink 22 is the heat transfer coefficient of the plurality of fins 24. It is well known that the convective heat transfer coefficient varies widely, over several orders of magnitude, and depends principally on the fluid velocity, the characteristics of the fluid, and, very importantly, on whether the fluid is experiencing a change of phase. (See for instance Walker, *Industrial Heat Exchangers, A Basic Guide*, pages 28–31, 2nd Ed, 1990.) Thus, according to conventional theory, the heat transfer coefficient is defined by the equation $$h = Nuk/De$$

where h is the convective heat-transfer coefficient, Nu is the Nusselt Number, a dimensionless number, and k is the thermal conductivity of the fluid; and De is the equivalent or hydraulic diameter of the formed fluid passageway. In this configuration, $$De = 4Ac/P,$$

where Ac is the flow cross sectional area of a fluid passageway, and P is the wetted perimeter or the surface area 34 of the plurality of fins 24 exposed to the fluid.

In the present invention, the plurality of fins 24 has a heat transfer coefficient (h) up to about 99 Btu/hr.–ft$^2$ deg F. For laminar forced convection heat transfer in ducts with fully developed temperature and velocity profiles, the Nusselt Number is constant. For a cross-sectional duct with a large aspect ratio and a constant wall temperature, the Nusselt Number converges to 7.54. The hydraulic diameter for a channel 0.008 inches wide by 0.5 inches tall is 0.0012 feet. Using the thermal conductivity of air as 0.0152 Btu/hr.–ft$^2$ deg F, the heat transfer coefficient (h) is therefore calculated to be 99 Btu/hr.–ft$^2$ deg F. It is important to appreciate that this high a value of heat transfer coefficient (h) was not obtainable in a compact heat exchanger, due to the inability of the tubeaxial fan to overcome high static pressures.

Figure 7:
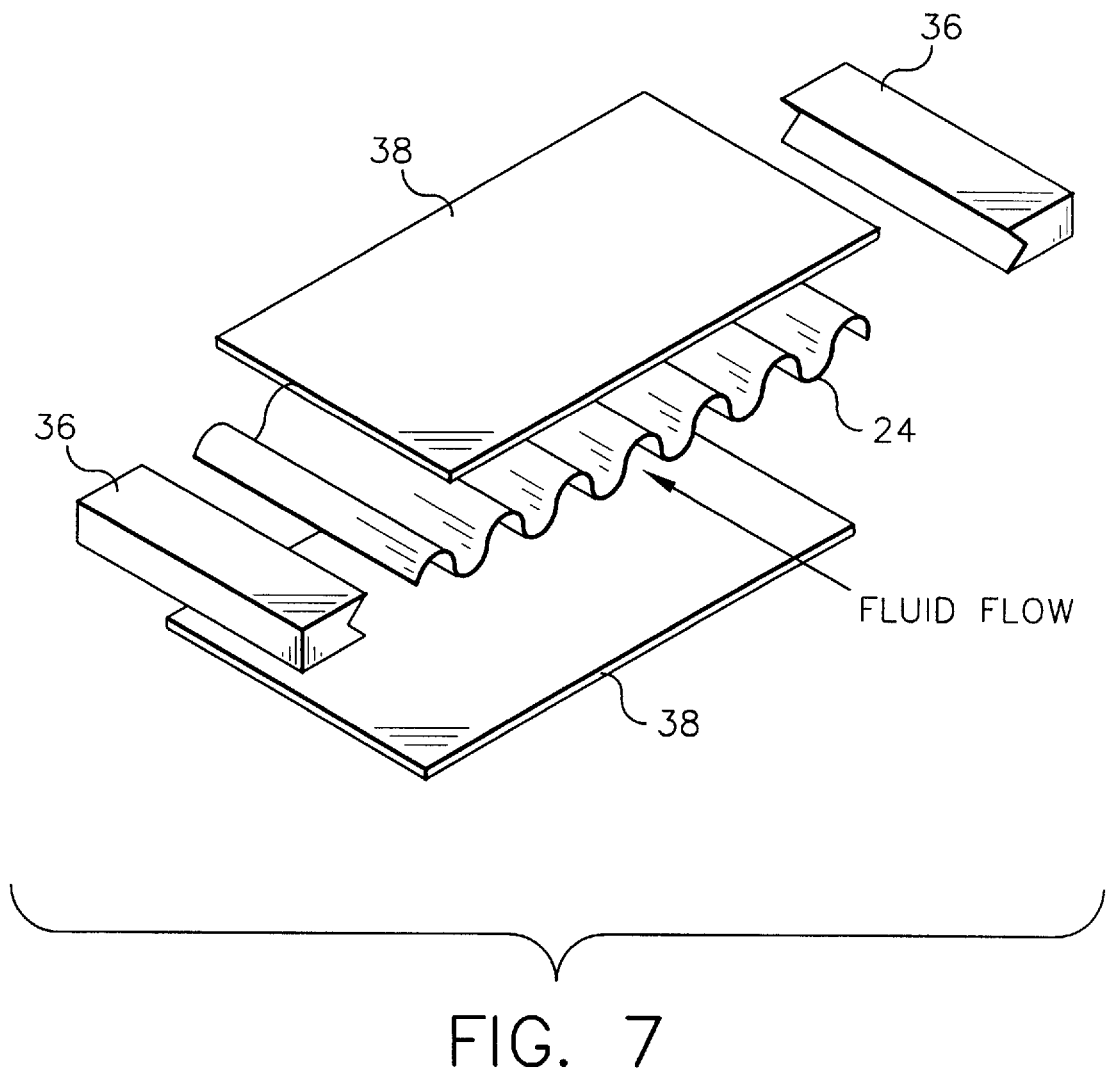
FIG. 7 is schematic view of an alternative heat sink configuration.

Referring again to FIGS. 4–5, the plurality of fins 24 are preferably generally rectangularly shaped and planar. Skilled artisans will, however, appreciate that fins 24 may take other configurations, such as folded (FIG. 7) or trapezoidal (not shown). As illustrated in FIG. 7, a typical folded fin arrangement may also include optional frame 36 for supporting the fin 36 and separator sheets 38 for separating each of the fins 24.

Air Moving Means 14

Figure 6:
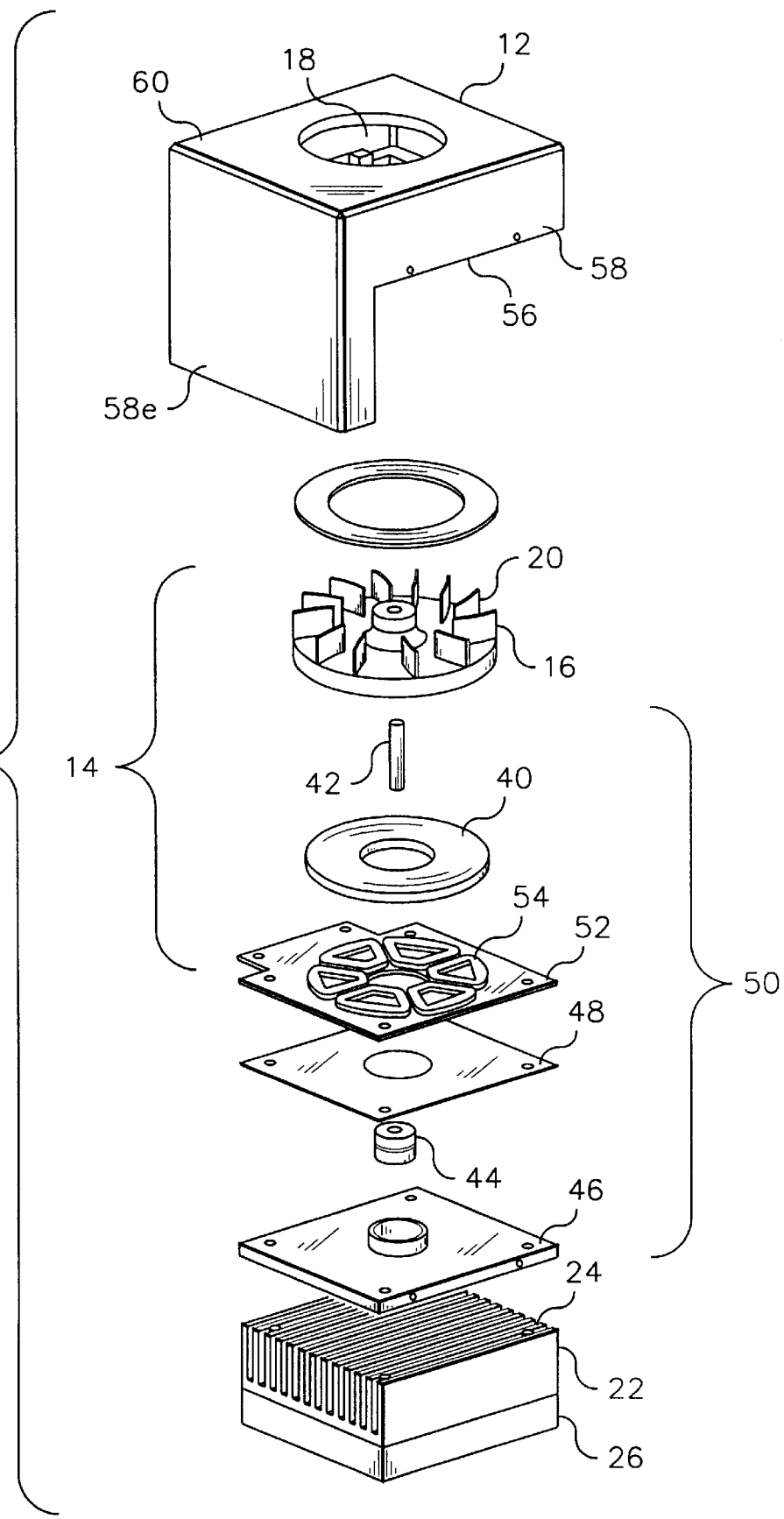
FIG. 6 is an exploded view of the air moving means of the invention.

According to FIG. 2, 3 & 6, improved heat exchanger 10 of the invention includes air moving means 14 structurally connected to the heat sink 22. Shown clearly in the exploded view of FIG. 6, air moving means 14 comprises at least a partial enclosure or housing, 12, which is configured to direct fluid into the enclosure 12 and then direct the fluid through enclosure 12, as described below. Impeller 16 is arranged for rotational movement in the enclosure 12. Further, impeller 16 has a plurality of backward curved blades 20 exposed to opening 18 in enclosure 12 for convectively moving fluid into the at least partial enclosure 12. Thereafter, the convectively moving fluid travels through the inlet face 30 and then through the plurality of fluid passageways 28 of the heat sink 22 before exiting the outlet face 32 of heat sink 22. It is important to the invention that impeller 16 is capable of producing a fluid velocity and static pressure to force fluid outside the opening 18 and through the enclosure 12 through the closely spaced fins 24 of the heat sink 22.

Referring again to the exploded view of FIG. 6, air moving means 14 is depicted having housing 12 and an impeller 16 disposed in the housing 12. Further, a permanent magnet 40 is mounted to impeller 16 and a drive shaft 42. Magnet 40 cooperates with the drive means, discussed below, for controlling the rotation of impeller 16. Moreover, base assembly (not shown) includes bearings 44 to hold the shaft 42, a base plate 46 to accept the bearings 44, and a flux return plate 48 to minimize eddy current losses in the drive means 50, described below.

Figure 3:
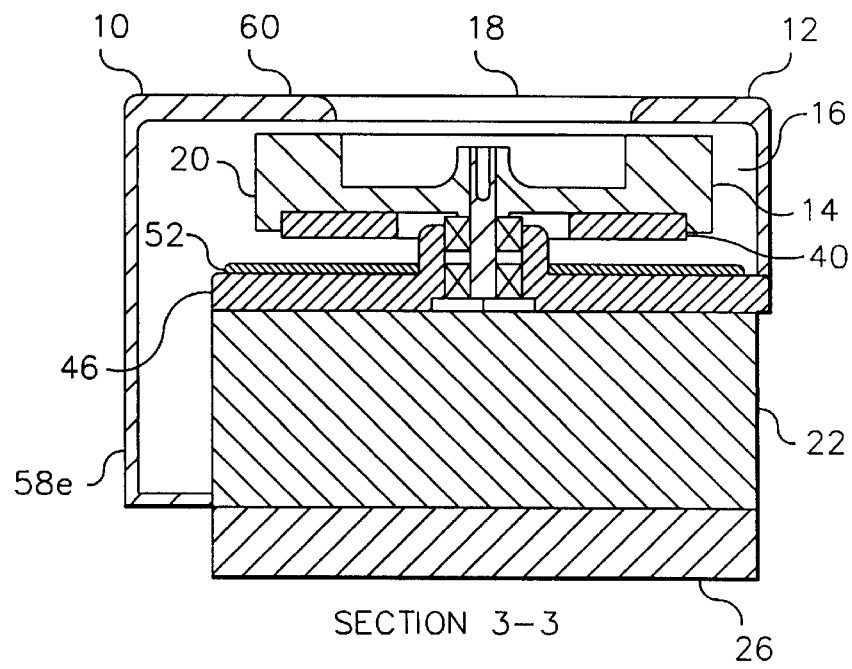
FIG. 3 is a section view along lines 3—3 of FIG. 2.

Illustrated in FIGS. 3 & 6, drive means, preferably a compact dc motor, 50, operably connected to the impeller 16 is provided for producing the rotational movement of the impeller 16 in enclosure 12. DC motor 50 comprises a circuit board 52 for actuating the motor. Circuit board 52 includes a plurality of metallic coils 54 arranged in magnetic proximity to magnet 40 mounted to the impeller 16. The metallic coils 40 are configured to receive a current and thereby produce rotational movement of the impeller 16 in response to the current. Utilizing planar motor technology coupled with backward curved impeller design, illustrated in FIG. 6, we are now able to produce the dc motor/fan combination of the invention with superior air flow characteristics. The planar do motor technology makes use of a small compact motor, the preferred drive means, 50, with the capacity to deliver relatively high torque to size ratios. Operably associated with the backward curved impeller 16, the dc motor enables the impeller 16 to achieve much higher fluid flow rates and overcome abnormally high static pressures.

It is well known that the fins of the heat sink present a fundamental problem in the removal of heat because it is fundamentally more desirable to employ as many fins as practical and to make them as tall as practical to increase the surface area to aid in the removal of the heat. There becomes a practical limit to the height of the fin, as the taller the fin, the lower the fin efficiency. Anything higher than this practical limit has negligible impact on increasing the heat transfer. Consequently, when large fins 24 with small spacing $S_f$ are used, the restriction to air flow is greatly increased. As indicated, conventional air movers do not have the static pressure capacity to achieve a high velocity through the heat sink, thus limiting their thermal performance. Using the heat exchanger 10 of the invention, it is now possible to employ therewith a backward curved impeller 16, as described herein, driven by a direct mounted, small dc motor (see for instance commonly owned U.S. Pat. No. 5,146,144, hereby incorporated herein by reference) with sufficient speed/torque characteristics to overcome the restriction in the fluid passageways 28 formed by the plurality of closely spaced fins 24. Moreover, the heat exchanger 10, as described, is adapted to drive fluid (air) at a high velocity through the heat sink, thus achieving superior thermal performance. The direct mounted planar motor blower can therefore match the performance that a removable mounted blower can provide, while maintaining the advantage of a compact and self contained solution that previously was unobtainable.

Figure 11:
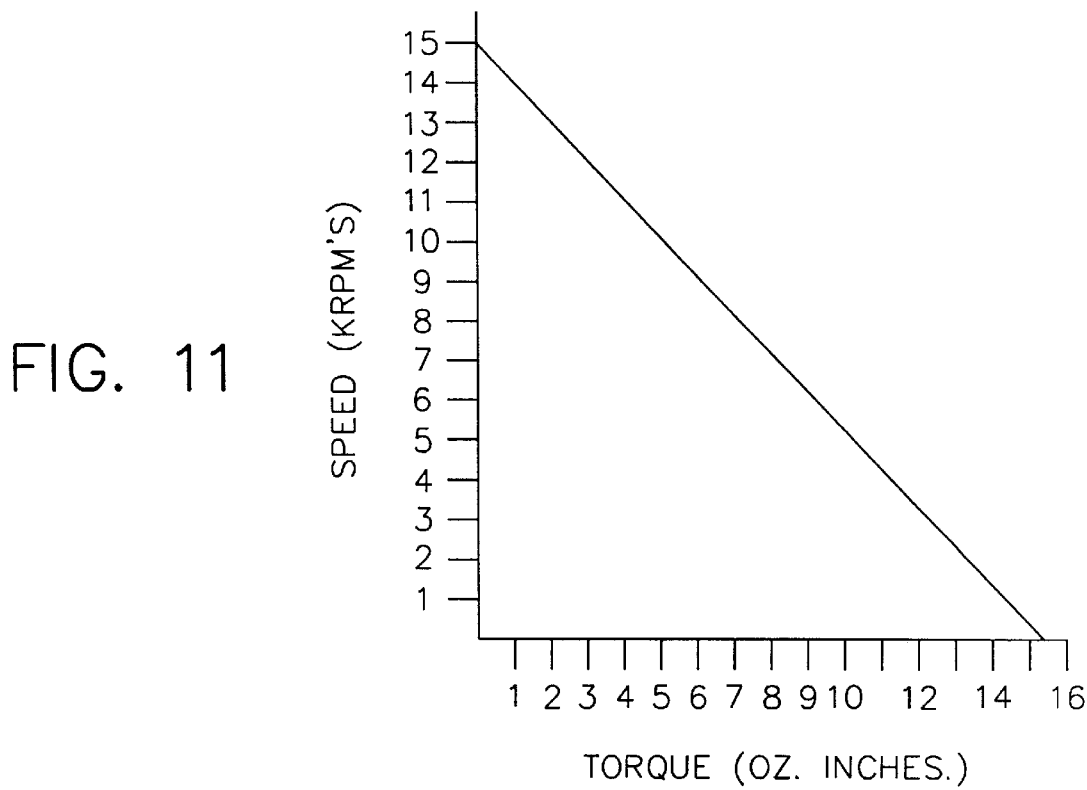

More particularly, according to performance curve in FIG. 11, drive means or dc motor 50 is configured to produce an impeller speed of about 4000 RPM to about 15000 RPM. Further, FIG. 11 provides the full range of speeds that impeller 16 is capable of achieving by employing the preferred dc motor of the invention.

Figure 8:
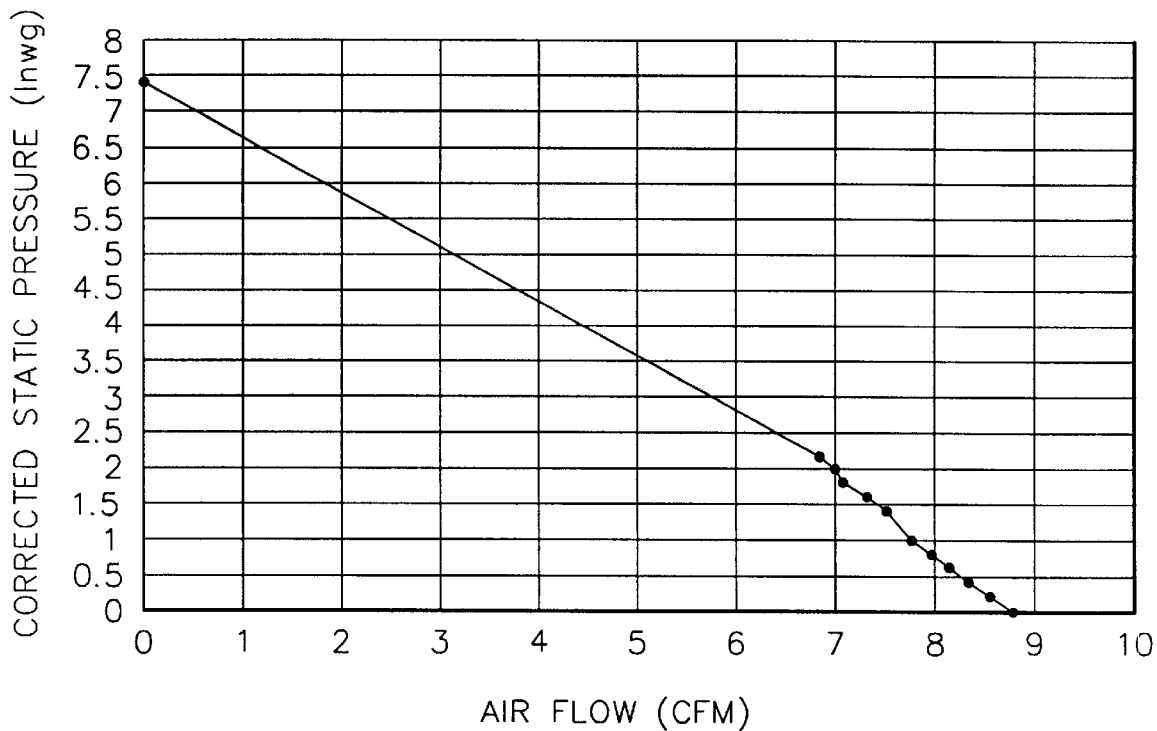
FIGS. 8–10 show typical air mover performance curves for different impeller inlet diameters; and, FIG. 11 shows the speed torque curve for the drive motor of the invention.
Figure 9:
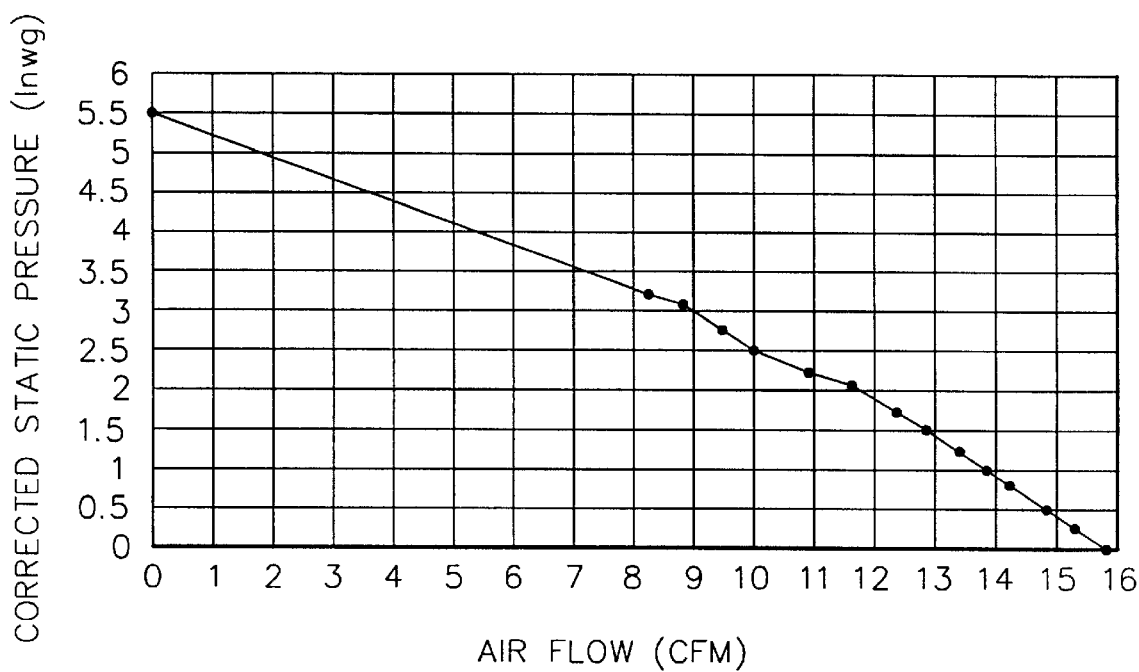
Figure 10:
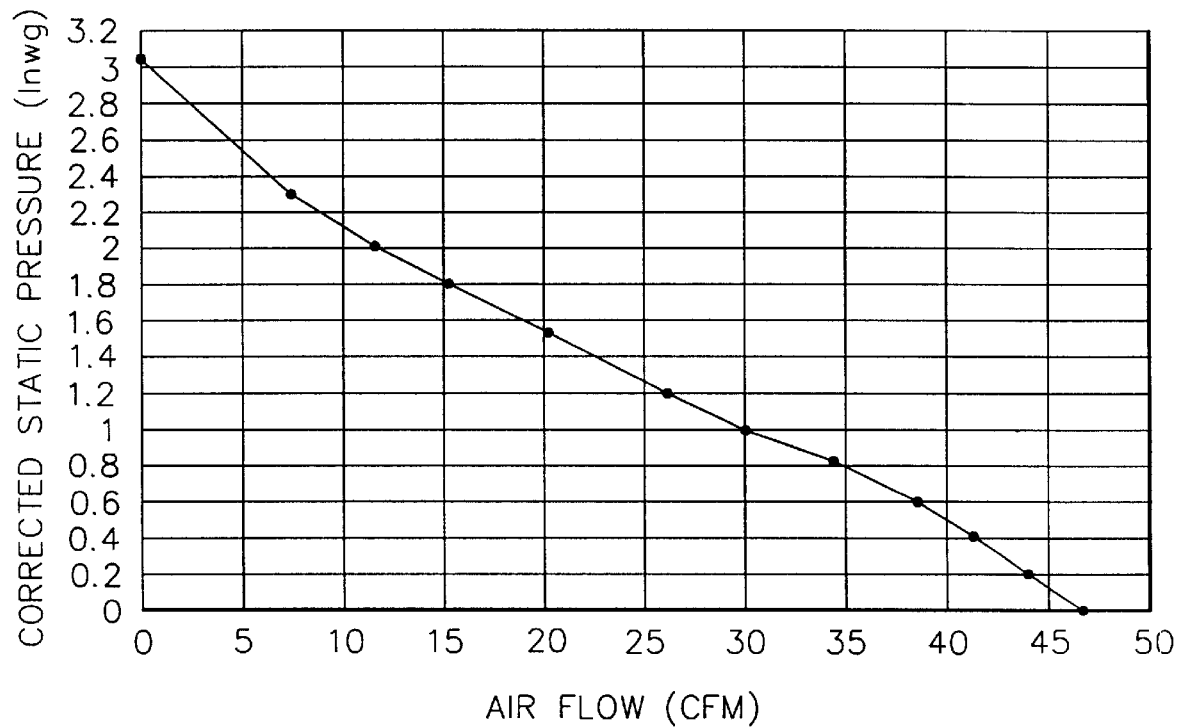

Furthermore, the preferred drive means or dc motor, 50, is configured to produce a static pressure up to about 8 inches of water. FIGS. 8, 9, and 10 show the air movers performance curve as a function of resistance to airflow (static pressure). The results generally indicate that this compact air mover 14 employing our planar motor technology is capable of achieving 20x increase in static pressure compared to a typical tubeaxial heat exchanger such as the one described in the prior art above. According to FIGS. 8, 9, 10, air mover performance curves are depicted for a backward curve impeller 16 (or wheel) where the outside dimension of the impeller 16 (wheel) is held constant. The inside diameter (or inlet area) of the impeller 16 (wheel) is then varied, which effects the slope of the air movers performance curve. Thus, by varying the impeller dimensions, an infinite amount of different air mover performance curves are obtainable. This applies to both the inlet diameter as well as the outside diameter.

Since size is an important feature of the invention, the preferred air moving means 14 of the invention has a height less than about 1.125 inches (cm) and a width of less than about 6 inches.

Enclosure 12

Figure 1:
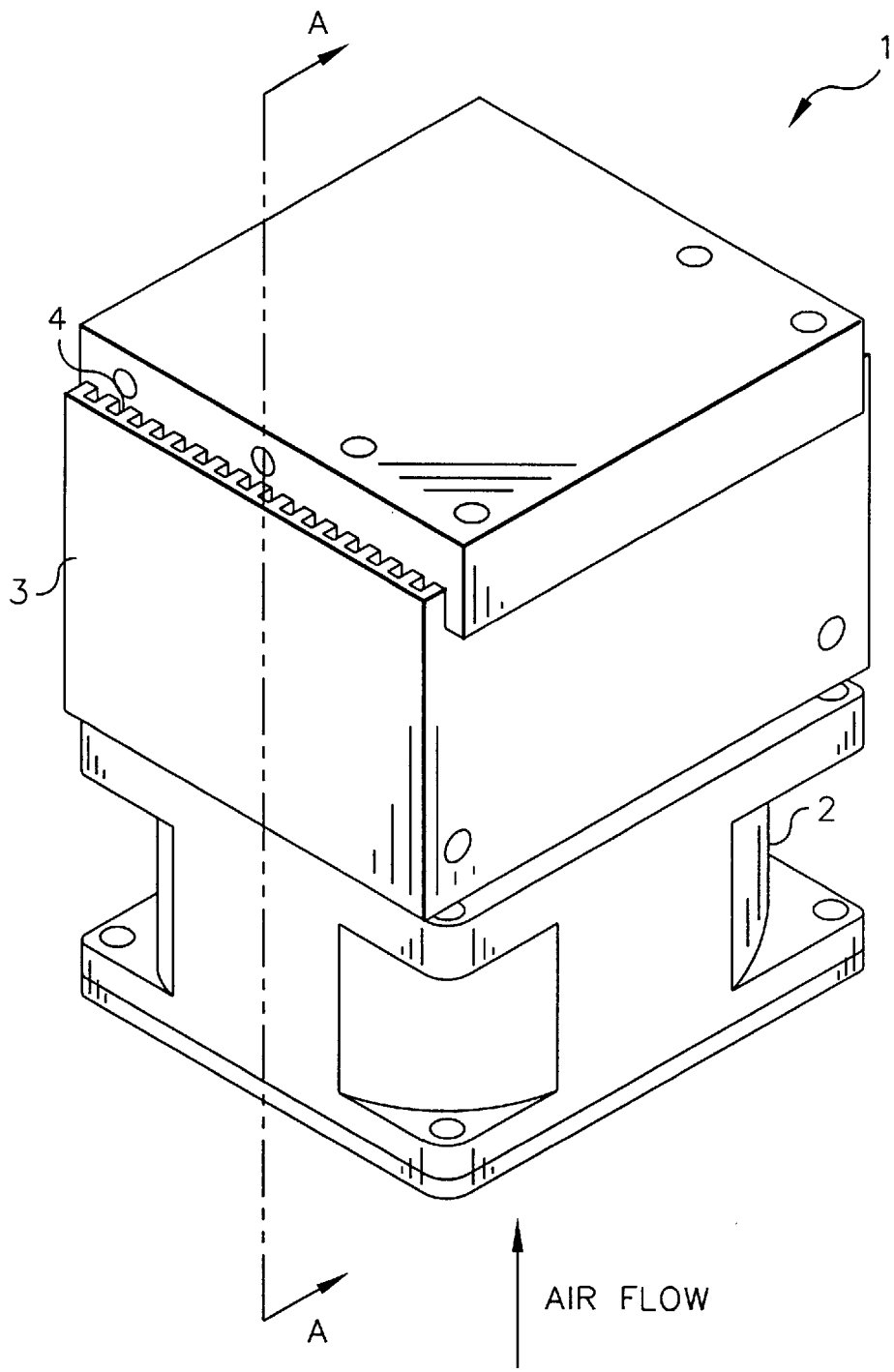
FIG. 1 shows a prior art heat exchanger.

Referring particularly to FIG. 6, enclosure 12 preferably comprises an interior compartment 56 formed by adjoining sidewalls 58 and a top wall 60. One of the sidewalls $58_e$ extends beyond the other adjoining sidewalls 56. The top wall 60 has opening 18 defining a fluid inlet end. A plenum chamber (not shown) is formed in interior compartment 56 between the opening, or fluid inlet end, 18, in the top wall 60 and the sidewall 58e that extends beyond the other sidewalls 58. The importance of plenum chamber of the invention is that it provides critical direction for fluid traveling from outside opening or fluid inlet end, 18 in the top wall 60 of the enclosure 12 into and through plenum chamber, then into the fluid inlet face 30 of the heat sink 22. The integrated design of the enclosure or housing 12 results in a more efficient means of directing fluid or air to the area that will be the most beneficial. A dual purpose of the housing is to ensure that there is no airflow bypass; that is, all the air that enters and exists through the heat sink (22). In the embodiment of the invention depicted in FIGS. 1–2, air moving means 14 having a backward curved impeller (described above) is used to take in air through the opening 18 of the top wall 60 of the heat sink 22 and direct it to the base 26 and fins 24 of the heat sink 22. This greatly increases the thermal efficiency of the heat sink 22.

Parts List 10 heat exchanger
12 housing or enclosure
14 air moving means
16 impeller
18 opening or air inlet end
20 backward curved blades of impeller
22 heat sink
24 fins of heat sink 22
26 base of heat sink 22
28 fluid passageways
30 fluid inlet face
32 fluid outlet face
34 surface area of fins
36 frame for alternate fin configuration
38 separator sheets for alternative fins
40 magnet
42 shaft
44 bearings 46 base plate
48 flux return plate
50 drive means or dc motor
52 circuit board
54 magnetic coils
56 interior compartment of housing 12
58 sidewalls
58e extended sidewall
60 top wall The invention has therefore been described with reference to certain embodiments thereof, but it will be understood that variations and modifications can be effected within the scope of the invention.

We claim:

1. An improved heat exchanger, comprising:

a heat sink having a closed base, a plurality of substantially parallel closely spaced fins supported by said base, said closely spaced fins forming a plurality of narrow fluid passageways, said plurality of fluid passageways having a fluid inlet face and a fluid outlet face opposite said fluid inlet face;

an air moving means structurally connected to said heat sink, said air moving means comprising at least a partial enclosure configured to direct fluid from outside said at least partial enclosure into and through said at least partial enclosure; an impeller arranged for rotational movement in said at least partial enclosure, said impeller having a plurality of backward curved blades exposed to an opening in said at least partial enclosure for convectively moving fluid into said at least partial enclosure and through said plurality of fluid passageways of said heat sink, said impeller being capable of producing a fluid velocity and static pressure to force said fluid outside said at least partial enclosure through the closely spaced fins of said heat sink;

wherein said at least partial enclosure comprises an interior compartment formed by adjoining sidewalls, one of said sidewalls extending beyond the other adjoining sidewalls, and a top wall, an opposed pair of said other adjoining sidewalls forming extensions of outermost fins of said heat sink, said top wall having said opening defining a fluid inlet end and wherein said interior compartment between said fluid inlet end and said one sidewall extending beyond said other adjoining sidewalls defines a plenum chamber for directing air from said top wall of said at least partial enclosure into and through said plenum chamber and into said fluid inlet face of said heat sink; and drive means operably connected to said impeller for producing the rotational movement of said impeller.

2. The improved heat exchanger recited in claim 1, wherein said drive means is a dc motor configured to produce a static pressure up to about 8 inches of water.

3. The improved heat exchanger recited in claim 1, wherein each of said plurality of fins is generally planar.

4. The heat exchanger recited in claim 1, wherein said fins are folded.

5. The improved heat exchanger recited in claim 1, wherein said plurality of fins have a heat transfer coefficient (h) up to about 99 Btu/hr.–ft$^2$ deg F.

6. The improved heat exchanger recited in claim 1, wherein said fluid passageways have an average space width between about 0.008 inches (0.02032 cm) to about 0.060 inches (0.1524 cm).

7. The heat exchanger recited in claim 1, wherein said air moving means has a height less than about 1.125 inches (2.8575 cm) and a width of less than about 6 inches (15.24 cm).

8. The improved heat exchanger recited in claim 1, wherein said drive means comprises a small compact DC motor.

9. The improved heat exchanger recited in claim 8, wherein said drive means further comprises a circuit board having a plurality of metallic coils arranged in magnetic proximity to said impeller, said magnetic coils being configured to receive a current and thereby produce rotational movement of said impeller in response to said current.

10. The improved heat exchanger recited in claim 9, wherein said DC motor is configured to produce an impeller speed of about 4000 RPM to about 15000 RPM.

* * * * *